United States Patent [19]
Kozuka et al.

[11] Patent Number: 5,622,769
[45] Date of Patent: Apr. 22, 1997

[54] CERAMIC CIRCUIT BOARD HAVING A THERMAL CONDUCTIVITY SUBSTRATE

[75] Inventors: Shoji Kozuka, Kawasaki; Masaru Hayashi, Yokohama; Katsuyoshi Oh-Ishi; Takaaki Yasumoto, both of Kawasaki; Nobuo Iwase, Kamakura; Hiroshi Endo, Yokohama; Koji Yamakawa, Kawasaki; Kaoru Koiwa, Kawasaki; Kiyoshi Iyogi, Kawasaki, all of Japan

[73] Assignee: Kabushiki Kaisha Toshiba, Kawasaki, Japan

[21] Appl. No.: 194,495

[22] Filed: Feb. 10, 1994

[30] Foreign Application Priority Data

Feb. 12, 1993 [JP] Japan .................... 5-023105

[51] Int. Cl.$^6$ ................................ B32B 3/00
[52] U.S. Cl. ............... 428/209; 428/901; 174/137 A; 174/137 R; 361/321.3; 361/321.5; 361/765; 361/777; 501/15; 501/153
[58] Field of Search ................. 428/210, 209, 428/224, 901; 264/60, 61; 423/582; 174/209, 137 A, 137 B; 427/443.1, 305, 321 R, 96, 98, 102, 103; 156/89; 501/78, 79, 73, 20, 89, 153; 361/321.4, 320, 321.1, 321.5, 321.3, 748, 750, 751, 757, 761, 765, 735, 777

[56] References Cited

U.S. PATENT DOCUMENTS

| | | | |
|---|---|---|---|
| 4,649,125 | 3/1987 | Takeuchi et al. | 501/15 |
| 4,766,010 | 8/1988 | Takeuchi et al. | 427/96 |
| 4,817,304 | 4/1989 | Takeuchi et al. | 501/15 |
| 4,865,877 | 9/1989 | Yamaguchi et al. | 427/98 |
| 5,214,991 | 6/1993 | Shimizu et al. | 83/168 |
| 5,326,623 | 7/1994 | Yamakawa et al. | 428/210 |

*Primary Examiner*—Merrick Dixon
*Attorney, Agent, or Firm*—Finnegan, Henderson, Farabow, Garrett & Dunner, L.L.P.

[57] ABSTRACT

According to this invention, there is disclosed a thermal conductivity substrate which includes an aluminum nitride sintered body and a coating layer formed on the body of aluminum phosphate and having a surface roughness of 1 μm or less, and which has excellent humidity resistance and chemical resistance.

5 Claims, 1 Drawing Sheet

CERAMIC CIRCUIT BOARD HAVING A THERMAL CONDUCTIVITY SUBSTRATE

BACKGROUND OF THE INVENTION

1. Field of the Invention

The present invention relates to a thermal conductivity substrate, a method of manufacturing the same, and a ceramic circuit board.

2. Description of the Related Art

Since an aluminum nitride sintered body (AlN sintered body) is excellent in heat dissipation properties, simplicity of a manufacturing method, influence to the environment, and electrical characteristics, the aluminum nitride sintered body is attracting attention as a substrate material for a ceramic circuit board. However, nitrogen in the AlN sintered body is eluted by the humidity or a chemical in the air, and the quality of the AlN sintered body is degraded. For this reason, the AlN sintered body has poor chemical stability.

Therefore, Jap. Pat. Appln. KOKAI Publication No. 63-170289 discloses a method of forming an oxide film on the surface of an AlN sintered body to chemically stabilize the AlN sintered body, i.e., a method of preventing elution of N (nitrogen) from the sintered body. However, this method requires strict control of the temperature and atmosphere to form a target oxide film. As a result, the manufacturing operation becomes cumbersome. In addition, cracks may occur in the oxide film due to the difference between thermal expansion coefficients of the oxide film and the AlN sintered body. Since the oxide film is bonded to the sintered body with a weak force, the oxide film is easily removed upon metallization on the oxide film.

Jap. Pat. Appln. KOKAI Publication No. 63-210005 discloses that the surface of a ceramic substrate such as an aluminum nitride substrate is toughened by hot phosphoric acid. The toughening process is performed using hot phosphoric acid which is obtained by heating strong phosphoric acid having a concentration of 75 to 90%, i.e., a pH of 1 or less, at 250° to 360° C. In addition, this publication discloses that the surface of the ceramic substrate is toughened by the hot phosphoric acid and metallized to manufacture a ceramic circuit board.

However, in this method, since the surface of the ceramic substrate is toughened by the hot phosphoric acid, the following problem is posed. For example, when a conductive pattern is to be formed on the surface of the ceramic substrate by a direct copper bonding (DCB) technique, after a copper plate is placed on the toughened surface of the ceramic substrate, they are heat-treated in a predetermined oxygen atmosphere at a high temperature at which a eutectic liquid phase between oxygen and copper is produced, so as to directly bond the copper plate to the ceramic substrate. In this process, a stress generated by the difference between the thermal expansion coefficients of the ceramic substrate and the copper plate acts on the interface therebetween. As a result, cracks are formed from the roughened part of the ceramic substrate. In addition, when a conductive pattern is to be formed on the surface of the ceramic substrate by a thick film technique, cracks are formed from the roughened part of the ceramic substrate when a conductive paste is sintered. When a conductive pattern is to be formed on the surface of the ceramic substrate by a thin film technique, a conductive thin film deposited by sputter deposition or the like cracks on the toughened surface of the substrate, and the conductive pattern is disconnected.

SUMMARY OF THE INVENTION

It is an object of the present invention to provide a thermal conductivity substrate which includes an aluminum nitride sintered body, and a coating layer having a high bonding force to the body, and has excellent humidity resistance and chemical resistance, and a flat surface.

It is another object of the present invention to provide a method of manufacturing a thermal conductivity substrate having the above excellent characteristics without performing any cumbersome operation.

It is still another object of the present invention to provide a highly reliable ceramic circuit board having excellent heat dissipation properties, wherein a conductive pattern free from disconnection is formed on a thermal conductivity substrate having excellent humidity resistance and chemical resistance and a flat surface.

According to the present invention, there is provided a thermal conductivity substrate comprising:

an aluminum nitride sintered body; and a coating layer formed on a surface of the aluminum nitride sintered body, essentially consisting of aluminum phosphate, and having a surface roughness of not more than 2 μm.

According to the present invention, there is provided a method of manufacturing a thermal conductivity substrate, comprising the step of causing aluminum nitride of an aluminum nitride sintered body to react with a phosphate on a surface of the aluminum nitride sintered body at a condition of a pH of not less than 3 to form a coating layer essentially consisting of aluminum phosphate on the surface of the body.

According to the present invention, there is provided a ceramic circuit board comprising:

a ceramic substrate including an aluminum nitride sintered body having a surface and a coating layer formed on the surface of the sintered body, the coating layer essentially consisting of aluminum phosphate and having a surface roughness of not more than 2 μm; and a conductive pattern formed on a surface of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1:
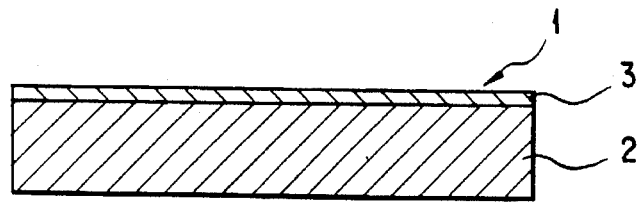
FIG. 1 is a sectional view showing a thermal conductivity substrate according to the present invention.

A thermal conductivity substrate according to the present invention will be described below with reference to FIG. 1.

A thermal conductivity substrate 1 has an aluminum nitride sintered body 2 and a coating layer 3 formed on the surface of the aluminum nitride sintered body 2, essentially consisting of an aluminum phosphate compound, and having a surface roughness of 2 μm or less.

The sintered body contains a sintering agent to improve the handling property, slurry stability, and a sintering property of an aluminum nitride (AlN) powder. As the sintering agent, a yttrium compound or a calcium compound is used. As the yttrium compound or calcium compound, for example, a carbonate, fluoride, or oxide of yttrium or calcium is used. In particular, a yttrium compound or calcium compound consisting of carbon, fluorine, and the like which are not left in a sintered body obtained after a sintering operation is performed is preferably used. When such a sintering agent is mixed with an aluminum nitride (AlN) powder, yttrium or calcium reacts with an impurity, e.g., $Al_2O_3$, in the AlN powder to densify the sintered body. As a result, an AlN sintered body having a high heat conductivity can be obtained.

The mixing amount of the sintering agent is preferably set to be 0.005 to 6 wt %, more preferably set to be 0.007 to 5 wt % with respect to the total amount of the AlN powder and the sintering agent due to the following reason. That is, when the mixing amount of the sintering agent is set to be less than 0.005 wt %, the sintered body is not sufficiently densified, and the sintered body may not have sufficient strength. On the other hand, when the mixing amount of the sintering agent exceeds 6 wt %, the amount of sintering agent components left in the sintered body increases, and the heat conductivity may decrease.

The coating layer 3 may coat the entire surface of the AlN sintered body 2 or only one surface of the AlN sintered body 2.

The coating layer 3 preferably has a thickness of 5 nm to 10 μm due to the following reason. That is, if the thickness of the coating layer is less than 5 nm, the edges of small uneven portions of the AlN sintered body surface cannot be completely coated with this coating layer, and continuous film formation cannot be performed. On the other hand, if the thickness of the coating layer exceeds 10 μm, the inner stress of the coating layer increases, and cracks may occur in the layer. The thickness of the coating layer more preferably falls within a range of 10 nm to 9 μm.

The surface roughness of the coating layer 3 is defined due to the following reason. That is, if the surface roughness of the coating layer 3 exceeds 2 μm, cracks are formed from the uneven portions when the coating layer 3 receives a thermal stress. The surface roughness of the coating layer is more preferably 1 μm or less.

The coating layer 3 may have a gradient in composition on the interface between the coating layer 3 and the sintered body. That is, the coating layer essentially consisting of aluminum phosphate may contain a large amount of Al on the sintered body side, and the amount of Al may be gradually decreased from the sintered body side.

In the thermal conductivity substrate according to the present invention, since the AlN sintered body surface is coated with the coating layer essentially consisting of aluminum phosphate, and the coating layer is more dense than an oxide film, humidity resistance and chemical resistance are improved. In addition, since the thermal conductivity substrate has a coating layer having a surface roughness of 2 μm or less, cracks occurring by a thermal stress generated in metallizing the surface of the coating layer can be prevented. Therefore, when the coating layer is formed on the thermal conductivity substrate, the thermal conductivity substrate can effectively exhibit the original excellent properties of an AlN sintered body without causing physical and chemical degradations. For example, the thermal conductivity substrate of the present invention has a thermal conductivity falling within a range of 300 W/m·K to 320 W/m·K, and has a high thermal conductivity which is almost equal to the thermal conductivity of the AlN sintered body itself.

In addition, when the composition of the coating layer has a gradient on the interface between the AlN sintered body and the coating layer, the bonding strength between the AlN sintered body and the coating layer can be increased.

In a method of manufacturing a thermal conductivity substrate according to the present invention, aluminum nitride of an aluminum nitride sintered body and a phosphate are reacted with each other on the surface of the sintered body under the condition of a pH of 3 or more. In this reaction, Al ions of aluminum nitride of the sintered body selectively react with phosphoric acid ions of a phosphate, so that a coating layer essentially consisting of aluminum phosphate is formed on the surface the sintered body. In addition, since the reaction condition is defined as a pH of 3 or more, the surface of the sintered body is prevented from being excessively etched by the phosphate, and a coating layer having a surface roughness of 2 μm or less can be formed.

The coating layer essentially consisting of an aluminum phosphate compound is actually formed by (1) Wet Method or (2) Dry Method which will be described below.

(1) Wet Method

A phosphate solution having a pH of 3 or more is coated on an AlN sintered body. This application process may be performed several times. The coating process is performed by any one of the following methods: an aqueous phosphate solution having a pH of 3 or more is prepared, and the AlN sintered body is dipped in this aqueous solution; an organic solution obtained by dissolving a phosphate powder in an organic solvent is prepared, and the AlN sintered body is dipped in this organic solution; the AlN sintered body is dipped in a melted phosphate; and the aqueous solution or the organic solution is dropped on the AlN sintered body, and spin coating is performed.

As the phosphate, various metal phosphates can be used. However, for example, if the obtained thermal conductivity substrate is applied as a ceramic circuit board, alkali metal ions such as Na ions or K ions or multivalent metal ions such as Fe ions or Mn ions must be prevented from being used as a constituent component of the phosphate. That is, if the alkali metal ions or multivalent metal ions are left on the surface of the thermal conductivity substrate, the surface resistance of the ceramic circuit board constituted by the thermal conductivity substrate is lowered. For this reason, non-metal cations are preferably used as a constituent component of the phosphate. However, since Ca, Zn, or Mg ions are confirmed not to lower the surface resistance, a phosphate containing these metal ions can be used. As these phosphates, e.g., $(NH_4)_3PO_4$, $(NH_4)_2HPO_4$, $NH_4H_2PO_4$, $Ca_3(PO_4)_2$, $Mg(H_2PO_4)_2 \cdot 2H_2O$, $Zn(H_2PO_4)_2 \cdot H_2O$, $(CH_3CH_2CH_2CH_2O)_3PO_4$, $(CH_3C_6H_4)_3PO_4$, and $(C_3H_5)_3PO_4$ can be used. In particular, of these phosphates, $NH_4H_2PO_4$ and $(NH_4)_2HPO_4$ are preferably used. The phosphate may contain a component such as Fe, Mg, Si, Ti, Zn, or Zr in an amount of several 100 ppm or less as an impurity.

In the above application process, the pH of the aqueous phosphate solution is defined due to the following reason. That is, if the pH of the aqueous solution is set to be less than 3, the aqueous solution becomes a strong acid solution, the etching of the AlN sintered body progresses, and a coating layer having a smooth surface cannot be formed. In addition, since the aqueous solution having the above pH value is chemically unstable, a uniform coating layer essentially consisting of an aluminum phosphate compound cannot be easily formed on the surface of the AlN sintered body.

The phosphorus concentration of the aqueous solution is preferably set to be 50 ppm or more due to the following reason. That is, if the phosphorus concentration is set to be less than 50 ppm, a coating layer having a sufficient thickness cannot be easily formed.

The pH value of the aqueous phosphate solution is preferably set to be 6.5 or more, i.e., the aqueous phosphate solution preferably has a phosphorus concentration of 100 ppm or more.

In the solution, reaction between the phosphate and aluminum nitride is preferably performed under heating. In the case where the heat-treatment temperature is 100° C. or more, the reaction can be sufficiently promoted. However, in consideration of the humidity resistance, the heat treatment is preferably performed at a temperature of 350° C. or more. Note that in the case where a melted phosphate heated to 350° C. or more is used, the above reaction can be promoted without especially performing a heat treatment. If the heat treatment is to be performed at a temperature of 500° C. or more, in order to prevent the surface of the AlN sintered body from being oxidized, the heat treatment is preferably performed in an inert atmosphere such as a nitrogen atmosphere or an argon atmosphere. In addition, the upper limit of the heat-treatment temperature is preferably set to be about 900° C.

A coating layer essentially consisting of an aluminum phosphate compound may be formed on a surface of the AlN sintered body by polishing the surface of the sintered body using a polishing solution containing a phosphate, leaving the polishing solution on the surface of the sintering body and performing a heat-treatment of the sintered body. In the polishing described above, since an active surface appears on the surface of the AlN substrate, the reaction between aluminum nitride and the phosphate in the polishing solution is performed more efficiently than that in the processing method using the dipping or spin coating. For this reason, the forming rate of the coating layer essentially consisting of an aluminum phosphate compound can be increased. In the polishing process of the AlN sintered body, although nitrogen is released from the polished surface of the sintered body so as to promote hydrolysis, when the forming process of the coating layer is performed after the polishing process, the hydrolysis can be advantageously prevented from being promoted.

The pH value and concentration of the phosphate contained in the polishing solution may be set as described above.

In the polishing process, the surface of the AlN sintered body may be polished by using a solution mixture of the polishing solution and another polishing solution containing polishing grains such as a silica powder, which solutions are supplied from two or more flow paths. In the process using dipping or spin coating, although the AlN sintered body must be subjected to a surface treatment, when the surface is polished using the polishing solution containing a phosphate, the surface treatment process can be omitted, and a thermal conductivity substrate can be manufactured at low cost.

(2) Dry Method

A target consisting of a phosphate such as $Ca_3(PO_4)_2$, $Mg(H_2PO_4)_2 \cdot 2H_2O$, $Zn(H_2PO_4)_2 \cdot H_2O$, or $AlPO_4$ is sputtered to form a sputtering film consisting of the phosphate on the surface of the AlN sintered body, and a coating layer essentially consisting of aluminum phosphate is formed on the surface of the sintered body. In the above reaction, a heat treatment may be performed to increase the reaction rate. Although the heat treatment can be satisfactorily performed at a temperature of 100° C. or more, it is preferably performed at 350° C. or more in consideration of humidity resistance. In the case where sputtering is performed in an atmosphere having a temperature of 350° C. or more, the reaction can be promoted without especially performing a heat treatment. In addition, the phosphate may be coated on the surface of the AlN sintered body using vacuum deposition or CVD in place of sputtering deposition so as to form a film consisting of a phosphate on the surface of the AlN sintered body.

In the wet method, the thickness of the coating layer is appropriately depended on the number of times of coating of the solution and the phosphorus concentration. In the dry method, the thickness is appropriately depended on the time for film formation. In order to form a stable coating layer, its thickness preferably falls within a range of 5 nm to 10 μm.

According to the method of the present invention, Al ions of the AlN sintered body selectively react with phosphoric acid ions of the phosphate, so that a coating layer essentially consisting of aluminum phosphate and having excellent humidity resistance and chemical resistance can be formed on the surface of the sintered body. In addition, since the reaction condition is defined as a pH of 3 or more, etching of the surface of the sintered body caused by the phosphate can be suppressed, and a coating layer essentially consisting of aluminum phosphate and having a surface roughness of 2 μm or less can be formed on the surface of the sintered body.

Figure 2:
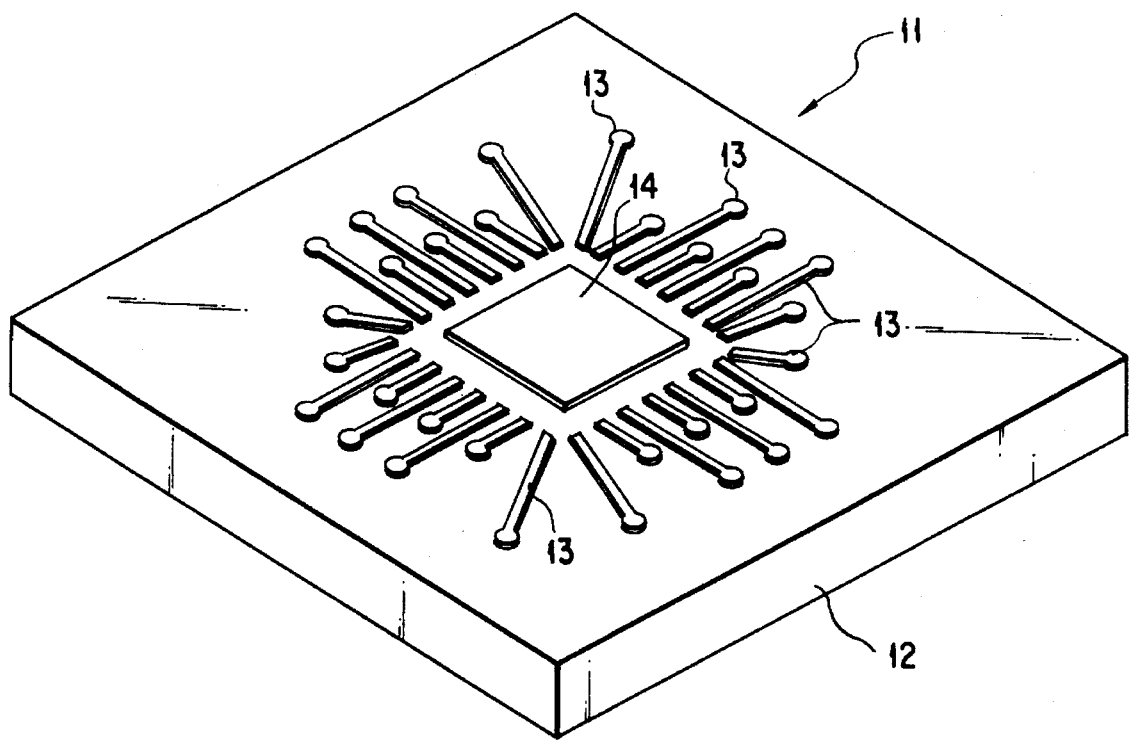
FIG. 2 is a perspective view showing a ceramic circuit board according to the present invention.

A ceramic circuit board according to the present invention will be described below with reference to FIG. 2.

A ceramic circuit board 11 has a ceramic substrate 12. A plurality of conductive patterns 13 are formed on the surface of the substrate 12. Note that reference numeral 14 in FIG. 2 denotes a semiconductor chip mounted on the substrate 12 of the ceramic circuit board 11.

The ceramic substrate comprises an AlN sintered body having a surface and a coating layer formed on the surface of the sintered body. The coating layer essentially consists of aluminum phosphate and has a surface roughness of 2 μm or less.

The ceramic substrate may comprise internal conductive patterns consisting of W or Mo and formed by, e.g., simultaneous sintering, and a via fill for connecting internal conductive patterns to each other and connecting the internal conductive patterns to the conductive patterns on the surface of the ceramic substrate. In the ceramic substrate having the internal conductive patterns, I/O pins, connected to the via fill, for performing inputting/outputting operations may be arranged on the lower surface of the substrate.

The conductive patterns are formed by, e.g., the following method.

(a) After a multilayered conductive thin film is formed by deposition such as sputtering deposition or vacuum deposition on the upper surface of the ceramic substrate, the multilayered conductive thin film is patterned. That is, the conductive patterns are formed by a so-called thin film technique.

As the multilayered conductive thin film, for example, a two-layered conductive thin film constituted by Ti/Cu films; and a multilayered conductive thin film having a first layer consisting of at least one metal selected from Ti, Cr, Mo, and W, a second layer consisting of at least one metal selected from Ni and Cu, and a third layer consisting of Au; a multilayered conductive thin film having a first layer consisting of Ti, nitrogen, and/or oxygen, a second layer essentially consisting of Cu, and a third layer consisting of Ti, nitrogen, and/or oxygen can be used.

As the method of the patterning described above, the following method is employed. For example, a resist pattern is formed on the multilayered thin film by a photoetching method, and the multilayered thin film is selectively removed by etching using the resist pattern as a mask.

(b) A conductive paste containing a conductive fine powder is coated on the surface of the ceramic substrate in the forms of patterns by, e.g., screen printing, dried, and then sintered. That is, the conductive patterns are formed by a so-called thick film technique.

As the conductive fine powder, e.g., a copper fine powder, a silver fine powder, or a gold fine powder can be used.

The sintering is preferably performed at 600° C. or more, more preferably, 1,050° to 1,085° C., in an inert atmosphere such as an argon gas or a nitrogen gas.

(c) The surface of the ceramic substrate is subjected to oxidation to form an oxide film having a predetermined thickness. Subsequently, after a copper plate containing 100 to 2,000 ppm of oxygen or a copper plate having a shape of conductive patterns is brought into contact with the oxide film, the resultant structure is heated at a temperature at which a eutectic alloy layer consisting of $Cu-Cu_2O$ is produced between the copper plate and the oxide film, thereby directly bonding the copper plate to the ceramic substrate. That is, conductive patterns are formed by a so-called direct copper bonding (DCB) method. Note that when a copper plate which is not patterned in advance is used, the copper plate is patterned after the bonding process so as to form conductive patterns.

The ceramic circuit board according to the present invention has the ceramic substrate 12 including an AlN sintered body having a surface and a coating layer formed on the surface of the sintered body, the coating layer essentially consisting of aluminum phosphate and having a surface roughness of 2 μm or less, and a structure in which the plurality of conductive patterns 13 are formed on the surface of the ceramic substrate 12. For this reason, in the case where the conductive patterns 13 are formed on the surface of the substrate 12 by the multilayered thin film technique described in (a), the surface of the substrate 12 is covered with a smooth coating layer. Therefore, a conductive thin film deposited on the coating layer can be prevented from cracking.

In the case where the conductive patterns 13 are formed on the surface of the substrate 12 by the thick film technique described in (b), a thermal stress is generated by the difference between the thermal expansion coefficients of the substrate 12 and the conductive patterns 13 formed thereon, when the printed conductive paste is sintered. Therefore, the thermal stress acts on the substrate 12. In the case where the conductive patterns 13 are to be formed on the surface of the substrate 12 by the DCB method described in (c), a thermal stress generated by the difference between the thermal expansion coefficients of the substrate 12 and the copper plate, during the bonding process of the copper plate. Therefore, the thermal stress acts on the substrate 12. Since the surface of the substrate is covered with the smooth coating layer, virtually no cracks are formed in the surface of the substrate 12 despite the thermal stress generated by the thick film technique or the DBC method.

The circuit board 11 has excellent humidity resistance and chemical resistance because the substrate 12 exposed from the conductive patterns 13 is covered with the coating layer essentially consisting of aluminum phosphate. In addition, since the ceramic substrate 12 has a high terminal conductivity AlN sintered body as a main constituent material, heat from the semiconductor chip 14 mounted on the substrate 12 can be dissipated well.

Therefore, a highly reliable ceramic board having excellent heat dissipation properties can be realized.

Preferable examples according to the present invention will be described below.

Examples 1–4

$Ca_3(PO_4)_2$, $(NH_4)_3PO_4$, $(NH_4)_2HPO_4$, and $NH_4H_2PO_4$, were dissolved in solvents shown in Table 1, respectively, and a plurality of aqueous solutions respectively having concentrations and pH values shown in Table 1 were prepared. AlN sintered bodies each obtained by sintering an AlN powder containing $Y_2O_3$ at a weight ratio of 5% were dipped in the aqueous solutions, respectively, for 1 minute, and were then removed from the aqueous solutions. Thereafter, a heat treatment was performed at temperatures shown in Table 1, and coating layers essentially consisting of aluminum phosphate and having surface roughnesses and thicknesses shown in Table 1 were formed, thereby forming thermal conductivity substrates of five types. Note that when the heat-treatment temperature was set to be 500° C. or more, the heat treatment was performed in an Ar gas atmosphere. When the heat-treatment temperature was set to be less than 500° C., the heat treatment was performed in the air.

A Ti film and an Au film were sequentially formed on one surface of each thermal conductivity substrate by sputtering to have thicknesses of 100 nm and 300 nm, respectively. An Au film was formed on each resultant structure by plating to have a thickness of 2 μm, so that conductive thin films each having a multilayered structure were formed. A resist pattern was formed on each conductive thin film by a photoetching method. The conductive thin film was selectively removed by etching using the resist pattern as a mask to form conductive patterns having a pitch of 90 μm, a width of 50 μm, and a length of 20 mm. As a result, ceramic circuit boards were manufactured.

Comparative Example 1

A Ti film and an Au film were sequentially formed by sputtering on an AlN sintered body formed following the same procedures as in Example 1 to have thicknesses of 100 nm and 300 nm, respectively, without processing the AlN sintered body with an aqueous phosphate solution. An Au film having a thickness of 2 μm was formed on the resultant structure by plating so as to form a conductive thin film having a multilayered structure. A resist pattern was formed on the conductive thin film by a photoetching method. The conductive thin film was selectively removed by etching using the resist pattern as a mask so as to form conductive patterns having a pitch of 90 μm, a width of 50 μm, and a length of 20 mm. As a result, a ceramic circuit board was manufactured.

Comparative Example 2

The AlN sintered body formed following the same procedures as in Example 1 was dipped in an aqueous hot phosphoric acid solution (pH: 1 or less) having an $H_3PO_4$ concentration of 80% at 300° C. for 5 minutes, and was pulled up from the solution. The AlN sintered body processed as described above had the surface roughness shown in Table 1, and a coating layer essentially consisting of an aluminum phosphate compound and having a thickness shown in Table 1 was formed on the surface of the AlN sintered body. A Ti film and an Au film were sequentially The presence/absence of cracks of the conductive patterns, the changes in weight, interwiring resistances, and bonding strengths are described in Table 1.

TABLE 1

|  | COMPOUND USED | SOLVENT | CONCENT- RATION (wt %) | pH | HEAT- TREATMENT TEMPERA- TURE (°C.) |
|---|---|---|---|---|---|
| EXAMPLE 1 | $Ca_3(PO_4)_2$ | DISTILLED WATER | 10 | 8 | 350 |
| EXAMPLE 2 | $(NH_4)_3PO_4$ | DISTILLED WATER | 30 | 11 | 500 |
| EXAMPLE 3 | $(NH_4)_2HPO_4$ | DISTILLED WATER | 25 | 9 | 550 |
| EXAMPLE 4 | $NH_4H_2PO_4$ | DISTILLED WATER | 18 | 5 | 280 |
| COMPARATIVE EXAMPLE 1 | NONE | NONE | — | — | — |
| COMPARATIVE EXAMPLE 2 | $H_3PO_4$ | DISTILLED WATER | 80 | <1 | 300 |

|  | THICK- NESS (nm) | SURFACE ROUGH- NESS (μm) | CHANGE IN WEIGHT (mg) | INTER- WIRING RESIS- TANCE (Ω) | BONDING STRENGTH (MPa) |
|---|---|---|---|---|---|
| EXAMPLE 1 | 50 | 0.4 | 0 | $1 \times 10^{12}$ | 30 |
| EXAMPLE 2 | 500 | 0.5 | 0 | $3 \times 10^{12}$ | 30 |
| EXAMPLE 3 | 1000 | 0.6 | 0 | $3 \times 10^{12}$ | 30 |
| EXAMPLE 4 | 10000 | 0.9 | 0 | $3 \times 10^{12}$ | 30 |
| COMPARATIVE EXAMPLE 1 | — | 0.5 | −50 | $6 \times 10^8$ | 30 |
| COMPARATIVE EXAMPLE 2 | 1000 | 3 | 0 | $7 \times 10^8$ | 5 | formed on one surface of the AlN sintered body by sputtering to have thicknesses of 100 nm and 300 nm, respectively. An Au film having a thickness of 2 μm was formed on the surface of the resultant structure by plating so as to form a conductive thin film having a multilayered structure. Thereafter, a resist pattern was formed on the conductive thin film by photoetching. The conductive thin film was selectively removed by etching using the resist pattern as a mask, so as to form conductive patterns having a pitch of 90 μm, a width of 50 μm, and a length of 20 mm. As a result, a ceramic circuit board was manufactured.

The presence/absence of cracks in the conductive patterns of the ceramic circuit boards formed in Examples 1 to 4 and Comparative Examples 1 and 2 were observed. In addition, the circuit boards were dipped in a 0.1M hydrochloric acid solution at a temperature of 100° C. for 2 hours, and a pressure cracker test was performed at 121° C. and 2 atm for 100 hours. A change in weight of each of the circuit boards caused by nitrogen elution was measured, and a resistance between conductive patterns of each of the circuit boards was measured.

A Ti film and an Au film were sequentially formed on the surface of each of the thermal conductivity substrates obtained by Examples 1 to 4 and the AlN sintered bodies obtained by Comparative Examples 1 and 2 to have thicknesses of 100 nm and 300 nm. After each structure was processed in a 2×2 mm square pattern, pins were brazed on the patterns and pulled up to measure the bonding strength.

As is apparent from Table 1, conductive patterns free from cracks are formed in the circuit boards (Examples 1 to 4) each having a thermal conductivity substrate with a surface on which a smooth coating layer is formed. In addition, as is understood from the measured amounts of eluted nitrogen, these circuit boards of Examples 1 to 4 have excellent humidity resistance and acid resistance.

In contrast to this, in the circuit board according to Comparative Example 1, although a conductive pattern free from cracks is formed, the amount of eluted nitrogen is large, and humidity resistance and acid resistance are low. As is seen from the measured amount of eluted nitrogen, the circuit board according to Comparative Example 2 has very excellent humidity resistance and acid resistance. However, since the surface of the circuit board is roughened, cracks occurred in the conductive patterns.

Examples 5–8

Four aqueous phosphate solutions having the phosphorus concentrations and pH values shown in Table 2 were prepared using phosphates $(NH_4)_3PO_4$ and $NaHPO_4$. The surfaces of AlN sintered bodies each having a 35×35 mm square shape and a thickness of 5 mm were polished for 10 minutes while aqueous phosphate solutions serving as polishing/washing solutions were flowed on the surfaces at a flow rate of 10 ml/min, respectively. The surfaces were washed with water to leave the polishing/washing solution only on the surfaces, and the resultant structures were heated at 100° C. for 1 hour so as to form four thermal conductivity substrates on which coating layer layers essentially consisting of an aluminum phosphate compound were formed.

Comparative Example 3

The surface of an AlN sintered body having a 35×35 mm square shape and a thickness of 5 mm was polished for 10 minutes while tap water serving as a polishing/washing solution was flowed on the surface of the AlN sintered body at a flow rate of 10 ml/min, and the resultant structure was washed with water and dried, so as to form a thermal conductivity substrate.

The surface roughnesses of the coating layers formed on the surface of each of the thermal conductivity substrates obtained by Examples 5 to 8 were measured. In addition, nitrogen was extracted from each of the thermal conductivity substrates according to Examples 5 to 8 and Comparative Example 3 by heating using water and an acid, and the amount of eluted nitrogen was quantified by steam distillation-Nessler's absorption spectrophotometry. The obtained results are described in Table 2.

solution. The aqueous phosphate solution was obtained by dissolving $(NH_4)_3PO_4$ with distilled water. The sintered body was heated at 350° C. to form a coating layer having a surface roughness of 0.6 μm and a thickness of 1,000 nm and essentially consisting of an aluminum phosphate compound, thereby forming a ceramic substrate. A paste was prepared by adding 3 wt % of a 5% aqueous PVA solution to a copper powder having a particle size of 0.9 μm, mixing therewith, and granulating the obtained mixture through a 200-mesh screen. Thereafter, the paste was coated on the substrate in a pattern form by a screen printing method, and the resultant structure was heated at 1,070° C. in a nitrogen atmosphere and sintered, thereby manufacturing a ceramic circuit board having a surface on which conductive patterns having a pitch of 150 μm, a width of 60 μm, and a length of 20 mm were formed.

The circuit board of Example 9, thus obtained was cut along a plane intersecting at right angles with the surface of the substrate, thus exposing a cross section of the board. The cross section was examined. It was found there were virtually no cracks formed in the surface of the substrate. In addition, after a change in weight caused by eluting nitrogen was measured by the same method as described in Example 1, a resistance between conductive patterns was measured.

TABLE 2

| | COMPOUND USED | PHOSPHORUS CONCENTRATION (ppm) | pH | SURFACE ROUGHNESS (μm) | AMOUNT OF ELUTED NITROGEN (μg/cm$^2$) |
|---|---|---|---|---|---|
| EXAMPLE 5 | $(NH_4)_3PO_4$ | 50 | 7 | 0.6 | 6 to 8 |
| EXAMPLE 6 | $(NH_4)_3PO_4$ | 200 | 7 | 0.4 | 1 to 2 |
| EXAMPLE 7 | $(NH_4)_3PO_4$ | 30 | 7 | 0.6 | 40 to 50 |
| EXAMPLE 8 | $NH_4H_2PO_4$ | 400 | 7 | 0.8 | 2 to 4 |
| COMPARATIVE EXAMPLE 3 | NONE | — | — | — | 100 |

As is apparent from Table 2, the thermal conductivity substrates according to Examples 5 to 8 have very smooth surfaces. As is understood from the measured amounts of eluted nitrogen, the thermal conductivity substrates of Examples 5 to 8 have very excellent humidity resistance and acid resistance.

Example 9

3 wt % of a $Y_2O_3$ powder having an average particle size of 0.1 μm and a purity 99.9% was added to an AlN powder having an average primary particle size of 0.6 μm and an impurity oxygen content of 1.0 wt %. Two sheets each having a thickness of 400 μm were formed by a doctor blade method using the obtained powder mixture. Subsequently, these sheets were stacked to each other at a pressure of 150 kgf/cm$^2$ and temperature of 80° C. for 40 minutes, and the resultant structure was cut into 25×25 mm squares. The multilayered body was heated to a maximum temperature of 600° C. in a nitrogen atmosphere to remove the binder in the multilayered body. Thereafter, the multilayered body was sintered at 1,800° C. and 1 atm in a nitrogen atmosphere for 3 hours so as to form AlN sintered body having a 20×20 mm square pattern and a thickness of 0.635 mm. When the thermal conductivity of the sintered body was measured by a laser flash method, the thermal conductivity was 200 W/m·K.

The AlN sintered body was dipped in an aqueous phosphate solution having a pH of 10 and a phosphorus concentration of 3,100 ppm for 1 minute and pulled up from the As a result, the change in weight was zero, and the inter-wiring resistance was $2 \times 10^{11}$ Ω.

Example 10

An AlN powder containing 3 wt % of yttrium oxide serving as a sintering agent was packed, sintered at the atmospheric pressure, and processed so as to form a plate-like AlN sintered body having a size of 35 mm×55 mm×0.7 mm. The AlN sintered body was dipped in an aqueous phosphate solution having a pH of 10 and a phosphorus concentration of 3,100 ppm for 1 minute and pulled up from the solution. The aqueous phosphate solution was obtained by dissolving $(NH_4)_3PO_4$ with distilled water. The sintered body was heated at 350° C. to form a coating layer having a surface roughness of 0.6 μm and a thickness of 1,000 nm and essentially consisting of an aluminum phosphate compound, thereby forming a ceramic substrate.

The ceramic substrate was heated at 1,130° C. in the air for 3 hours so as to form an aluminum oxide layer having a thickness of 1 μm on the surface of the substrate. A copper plate containing 400 ppm of oxygen and having a size of 20 mm×50 mm×0.3 mm was placed on the aluminum oxide layer of the substrate. The structure formed of the substrate and the copper plate was set in a heating furnace, and a nitrogen gas atmosphere containing 7 ppm of oxygen was set in the heating furnace. The substrate was heated such that a maximum temperature of 1,070° C. was kept for 3 minutes, and the heating furnace was cooled to room temperature. Then, the structure was removed from the furnace and examined. It was found that an eutecitic alloy layer consisting of Cu and $Cu_2O$ had been formed at the interface between the copper plate and the substrate, and that the copper plate was bonded firmly to the substrate. Next, peel strength test was performed on the structure, whereby it was confirmed that the copper plate was bonded to the substrate with high bonding strength of 11 kgf/cm.

Subsequently, the copper plate and the eutectic alloy layer were patterned by the photoetching method, thereby manufacturing a ceramic circuit board having conductive patterns consisting of copper.

The circuit board of Example 10, thus obtained was cut along a plane intersecting at right angles with the surface of the substrate, thus exposing a cross section of the board. The cross section was examined. It was found there were virtually no cracks formed in the surface of the substrate. In addition, it was confirmed that the conductive patterns of the circuit board had a high peel strength (11 kgf/cm) equal to that obtained when the copper plate was bonded. Furthermore, after a change in weight caused by eluting nitrogen was measured by the same method as described in Example 1, a resistance between conductive patterns was measured. As a result, the change in weight was zero, and the inter-wiring resistance was $2\times10^{11}$ Ω.

As has been described above, according to the present invention, there is provided a thermal conductivity substrate which includes an AlN sintered body, and a smooth coating layer having a high bonding force to the body and essentially consisting of aluminum phosphate, and which has excellent humidity resistance and chemical resistance. In addition, according to the present invention, there is also provided a method of manufacturing the thermal conductivity having the excellent characteristics by simple processes. Furthermore, according to the present invention, there is provided a highly reliable ceramic circuit board having excellent heat dissipation properties, wherein conductive patterns free from disconnection are formed on a thermal conductivity substrate having excellent humidity resistance and chemical resistance and a flat surface.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A ceramic circuit board comprising:
   a ceramic substrate including an aluminum nitride sintered body having a surface and a coating layer formed on the surface of said sintered body, said coating layer consisting essentially of aluminum phosphate and having a surface roughness of not more than 1 μm; and
   a conductive pattern formed on a surface of said coating layer.

2. The circuit board according to claim 1, wherein said conductive pattern is formed by stacking a plurality of conductive thin films on the surface of said coating layer to form a multilayered conductive film and patterning said multilayered conductive film.

3. The circuit board according to claim 2, wherein said multilayered conductive film has a first layer consisting of at least one metal selected from the group consisting of Ti, Cr, Mo, and W and a second layer consisting of one metal selected from the group consisting of Ni and Cu, and a third layer consisting of Au.

4. The circuit board according to claim 1, wherein said conductive pattern is formed by coating paste on the surface of said coating layer to form a coating pattern and sintering said coating pattern.

5. The circuit board according to claim 1, wherein said conductive pattern is formed by directly bonding a copper plate on the surface of said coating layer and patterning said copper plate.

* * * * *